US006295242B1

(12) United States Patent
Shu et al.

(10) Patent No.: US 6,295,242 B1
(45) Date of Patent: Sep. 25, 2001

(54) SRAM WITH CURRENT-MODE TEST READ DATA PATH

(75) Inventors: Lee-Lean Shu, Cupertino; Kurt Knorpp, Redwood City, both of CA (US); Katsunori Seno, Kanagawa (JP)

(73) Assignee: Sony Electronics, Inc., Tokyo (JP)

( * ) Notice: Subject to any disclaimer, the term of this patent is extended or adjusted under 35 U.S.C. 154(b) by 1211 days.

(21) Appl. No.: 08/722,486

(22) Filed: Sep. 27, 1996

Related U.S. Application Data

(60) Continuation of application No. 09/342,060, filed on Nov. 17, 1994, now abandoned, which is a division of application No. 07/942,296, filed on Sep. 9, 1992, now Pat. No. 5,384, 503.

(51) Int. Cl.[7] .......... G11C 11/40

(52) U.S. Cl. .......... 365/208; 365/207

(58) Field of Search .......... 355/207, 208, 355/190

(56) References Cited

U.S. PATENT DOCUMENTS 4,910,714 * 3/1990 Hartgring .......... 365/208
5,126,974 * 6/1992 Sasaki .......... 365/208
5,229,967 * 7/1993 Nogle .......... 363/208
5,291,045 * 3/1994 Atsumi .......... 365/51
5,339,273 * 8/1994 Taguchi .......... 365/201

* cited by examiner

*Primary Examiner*—A. Zarabian
(74) *Attorney, Agent, or Firm*—Sonnenschein, Nath & Rosenthal

(57) ABSTRACT

A current sensing, cascadable differential amplifier has a special bias circuit that provides a low impedance input and a high impedance output, whereby plural stages may be connected in cascade. Optionally, active current sources are used as pull-ups for the data lines, to increase the output impedance and improve the data line common mode level. The amplifier performs as a current sensing sense amplifier in a large scale, fast access semiconductor means and in this application, the memory does not need equalizing clock signals, nor is the access time slowed materially in the plural cascade stages.

4 Claims, 5 Drawing Sheets

TO GLOBAL DATALINES
2ND STAGE CURRENT
AMPLIFIERS
OUT
OUTB
IN
INb
FROM LOCAL
DATALINES
VREF
P1
P2
P3
P4
P7
P8
N1
N2
N3
N4
N5
N6
N7
N8

1ST STAGE
CURRENT
AMPLIFIER
2ND STAGE
CURRENT
AMPLIFIER
OUT2
OUT2b
TO CURRENT
VOLTAGE
CONVERTER
GLOBAL
DATALINES
WORD-
LINE
MEMORY CELL
LOGIC"O"
LOGIC"1"
Y-SELECT
VIN-
VINb+
P1
P2
P3
P4
P5
P6
P7
P8
N1
N2
N4
N5
N6
N7
N8
N9
P1A
P2A
P3A
P4A
P5A
P6A
P7A
N1A
N2A
N3A
N4A
N5A
N6A
R439
R438
R434
R35
R446
R442
R447
R444
R431
R433
R429
R430
C437
C434
C445
C443
C432
C428
N448
N458
N459
N449

OUT
OUTb
N6
N5
N4
N3
N2
N1
N7
N8
N9
P1
P2
P3
P4
P5
P6
P7
P8
i1
i2
i3
i4
IBIAS/n
IBIAS/n
IBIAS
i=iCELL
i=0
VIN-
VINb+
P439
P440
N436
N438
N434
N437
Y SELECT
LOGIC"1"
LOGIC"0"
WORD-LINE

SRAM WITH CURRENT-MODE TEST READ DATA PATH

This is a continuation of application Ser. No. 08/342,060, filed Nov. 17, 1994, abandoned—which is a divisional of application Ser. No. 07/942,296, filed Sep. 9, 1992, U.S. Pat. No. 5,384,503.

FIELD OF THE INVENTION

The present invention relates to static random access memories (SRAMs) and more particularly to SRAMs with a current-mode data path.

BACKGROUND

It has become increasingly difficult to generate and distribute short duration clock pulses on a large scale, for large scale high-speed memories. Such pulses have been required for equalization of the bit lines, etc., but the provision for such pulses prolongs access times and degrades performance of the memory. A current-mode read data path, however, eliminates the need for such clock pulses. Several amplifiers have been described in the literature, but the use of positive feedback to reduce the amplifier input resistance has limited the use of this type of amplifier to single-ended, single stage applications.

A description of a current-mode data path for an SRAM was published in the Apr. 19, 1991 edition of the IEEE Journal of Solid State Circuits. The paper, "Current-Mode Techniques For High-Speed Real Side Circuits", by E. Seevnick, et al., proposes the use of two complementary current amplifiers as local and global sense amplifiers in an SRAM data path. The detailed design of these amplifiers is, however, different from the amplifier of the present invention. Another paper, "Fast CMOS Current Amplifier And Buffer Stage", by Cemes and Ki describes a similar single stage current amplifier.

SUMMARY OF THE INVENTION

The present invention employs two cascade complementary differential current amplifiers in a readout circuit for an SRAM. The amplifiers employ special bias circuits and provide improved amplifier operation, allowing them to be connected in series or cascade. A small amplifier differential input resistance reduces the voltage swing of differential lines and thus eliminates the need for equalization clocks.

Whereas in the prior art, the single-ended amplifier has been unsuitable for SRAM data path applications where several stages of differential amplification are required, the amplifiers of the present invention employ a unique bias circuit which improves operation of the amplifiers and extends their use to differential cascaded applications, such as in an SRAM read data path.

BRIEF DESCRIPTION OF THE DRAWINGS

Reference will now be made to the accompanying drawings in which.

BRIEF DESCRIPTION OF THE PREFERRED EMBODIMENTS

Figure 1:
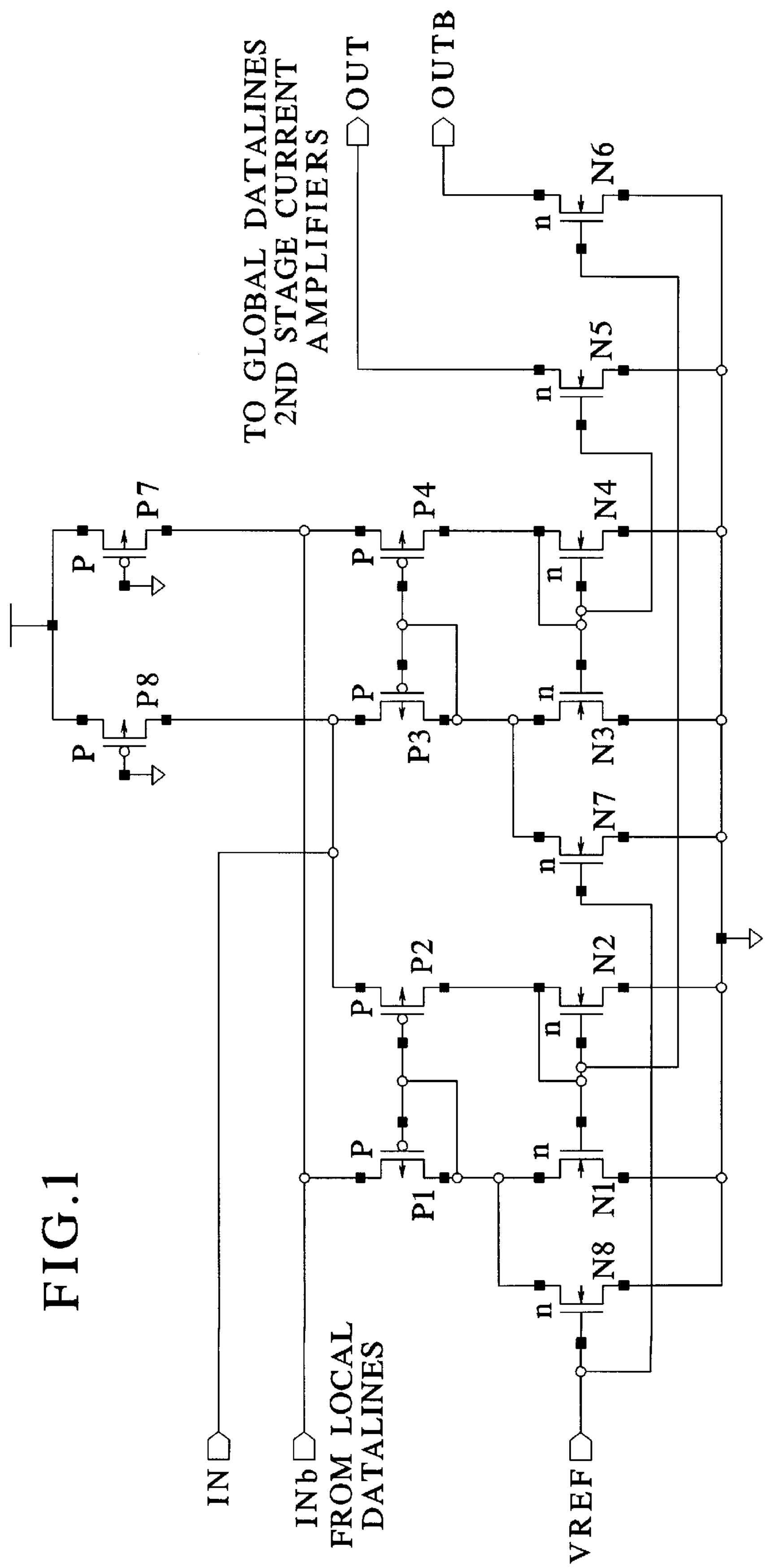
FIG. 1 is a schematic diagram of a first stage current amplifier for the read data path of an SRAM.

Referring now to FIG. 1, the first stage of an amplifier embodying the present invention is illustrated. It uses four PMOS transistors P1–P4 as input devices, and four NMOS transistors N1–N4 as load devices. NMOS transistors N5 and N6 serve as buffers which isolate the first stage output from the high capacitance global data lines. The circuit of FIG. 1 incorporates a bias circuit composed of transistors N7 and N8, with their gate electrodes connected to a reference voltage $V_{REF}$. PMOS transistors P7 and P8 serve the dual purpose of providing amplifier bias to Vcc, and as data line pull-ups.

Figure 2:
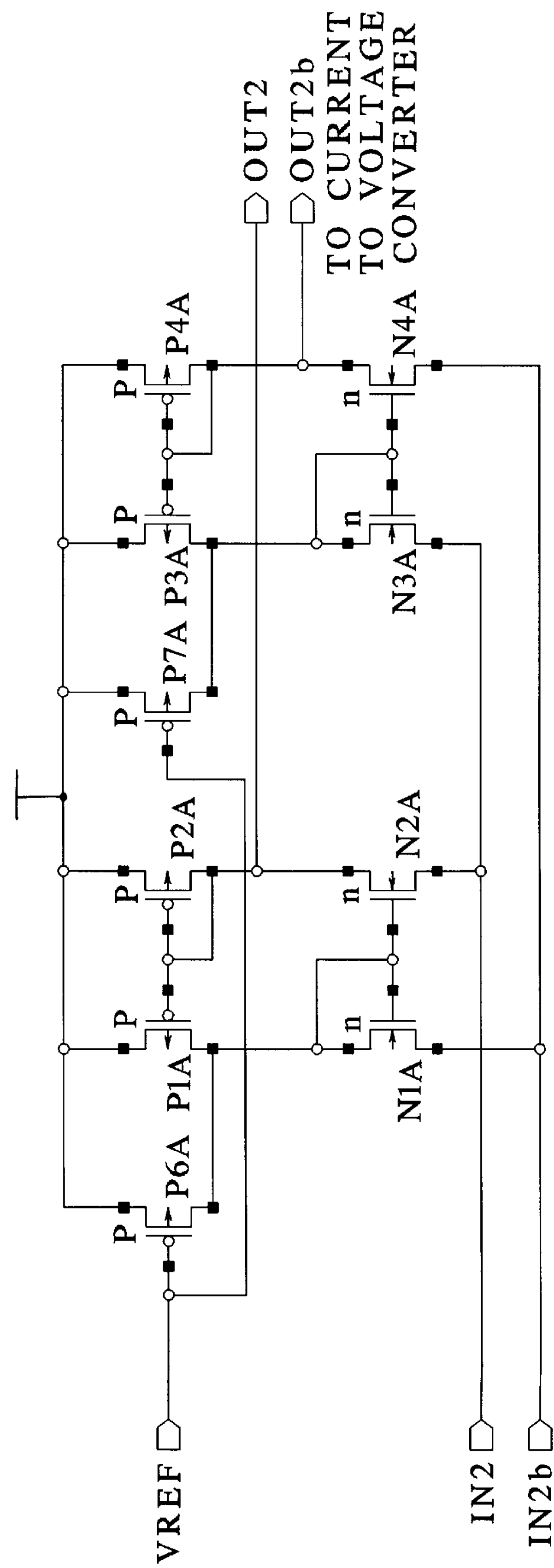
FIG. 2 is a second stage current amplifier for the read data path of an SRAM.

The second stage of the amplifier is illustrated in FIG. 2. it uses NMOS transistors N1A–N4A as input devices, and PMOS transistors P1A–P4A as load devices. The bias circuit is composed of transistors P6A and P7A, having their gate electrodes connected to a reference voltage $V_{REF}$.

Figure 3:
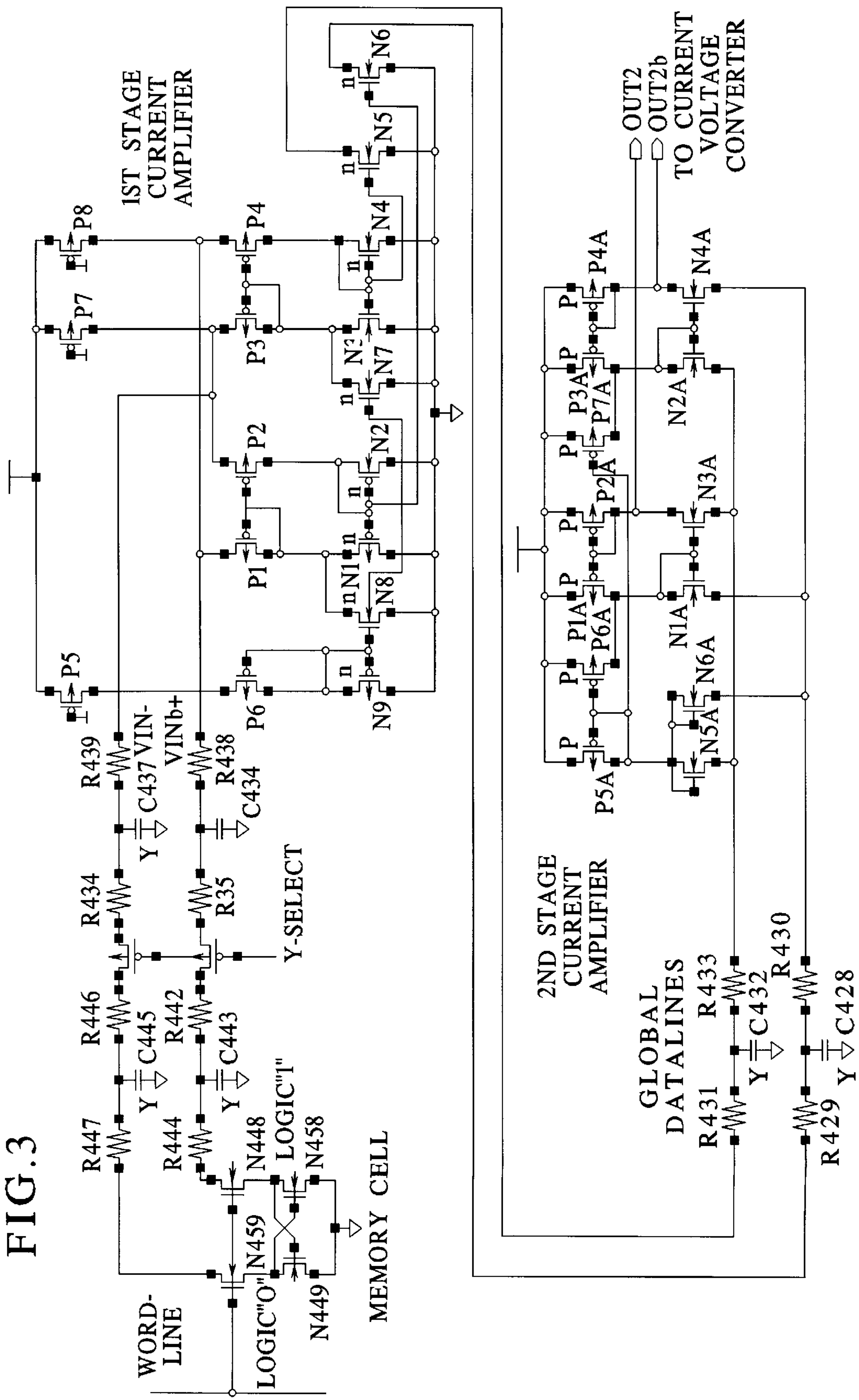
FIG. 3 is a schematic circuit diagram of a portion of a memory cell array, with the two stage amplifier of the present invention.

FIG. 3 illustrates the manner in which the first and second stages are connected in an SRAM read data path. In the implementation illustrated in FIG. 3, the voltage reference circuits for the first stage are formed by transistors P5, P6 and N9, and the voltage reference circuits for the second stage comprise resistors P5A, N5A and N6A.

Figure 4:
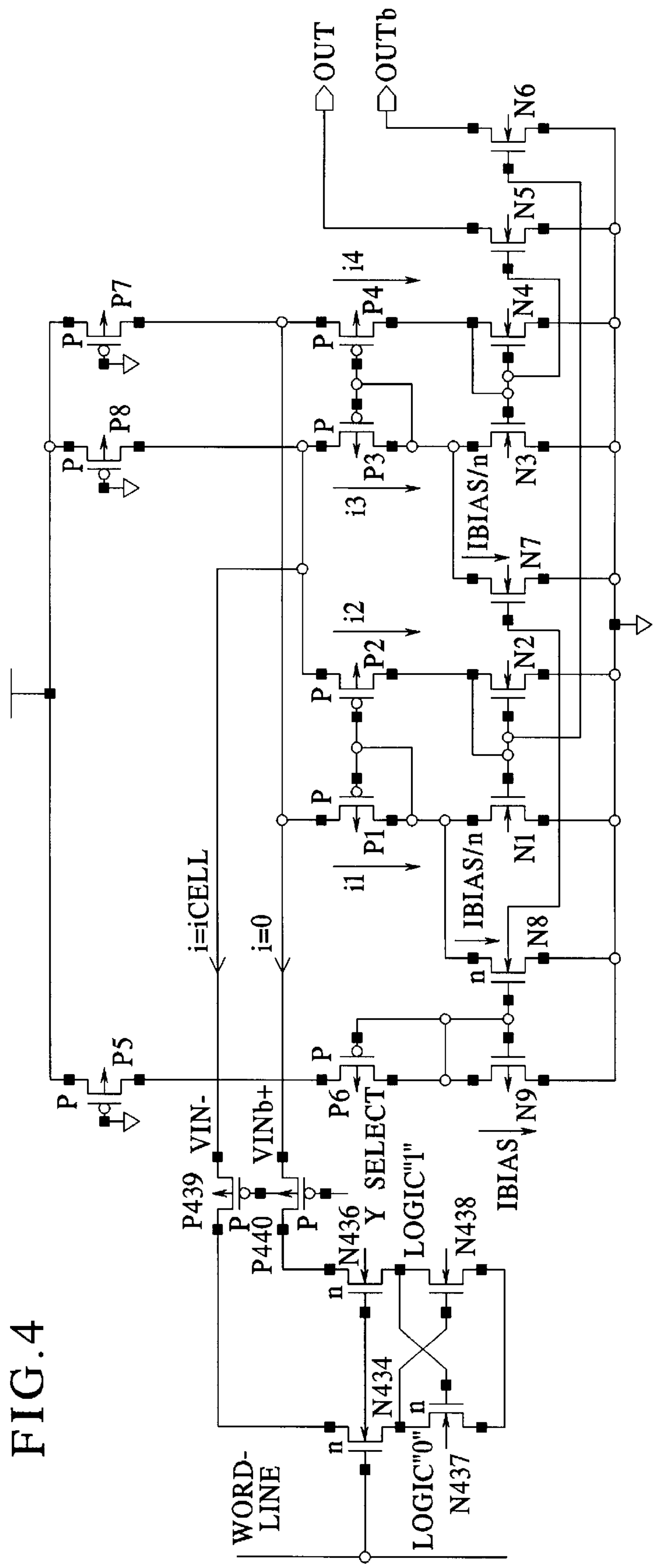
FIG. 4 is a schematic circuit diagram of the first stage of a current amplifier of the present invention.

FIG. 4, which illustrates a schematic diagram of the first stage, illustrates the manner in which the amplifiers operate. Both stages operate identically. When the PMOS and NMOS devices have aspect ratios, such that $$W/L_{P2/P4}/W/L_{P1/P3}*W/L_{N1/N3}/W/L_{N2/N4}=1$$

then differential input voltage of the amplifier $V_{IN}-V_{INB}$, is forced to zero. When $V_{IN}=V_{INB}$, the current $I_2$ through the input device P2 is a multiple of the current I1 through the input device P1. Similarly, the current I4 through P4 is a multiple of the current I3, through P3. This gives rise to two beneficial characteristics of the amplifier, namely a small differential input resistance, and current repetition. These features make the amplifier useful for reading the contents of an SRAM memory cell. In such an application, the small input resistance of the amplifier limits the swing of the differential data lines, and thus eliminates the need for equalization clocks, which are typically generated at the time of address detection. The amplifier current repetition capability can be used to isolate the memory cell from high capacitance bit lines and data lines, thus reducing data path delay times.

Figure 5:
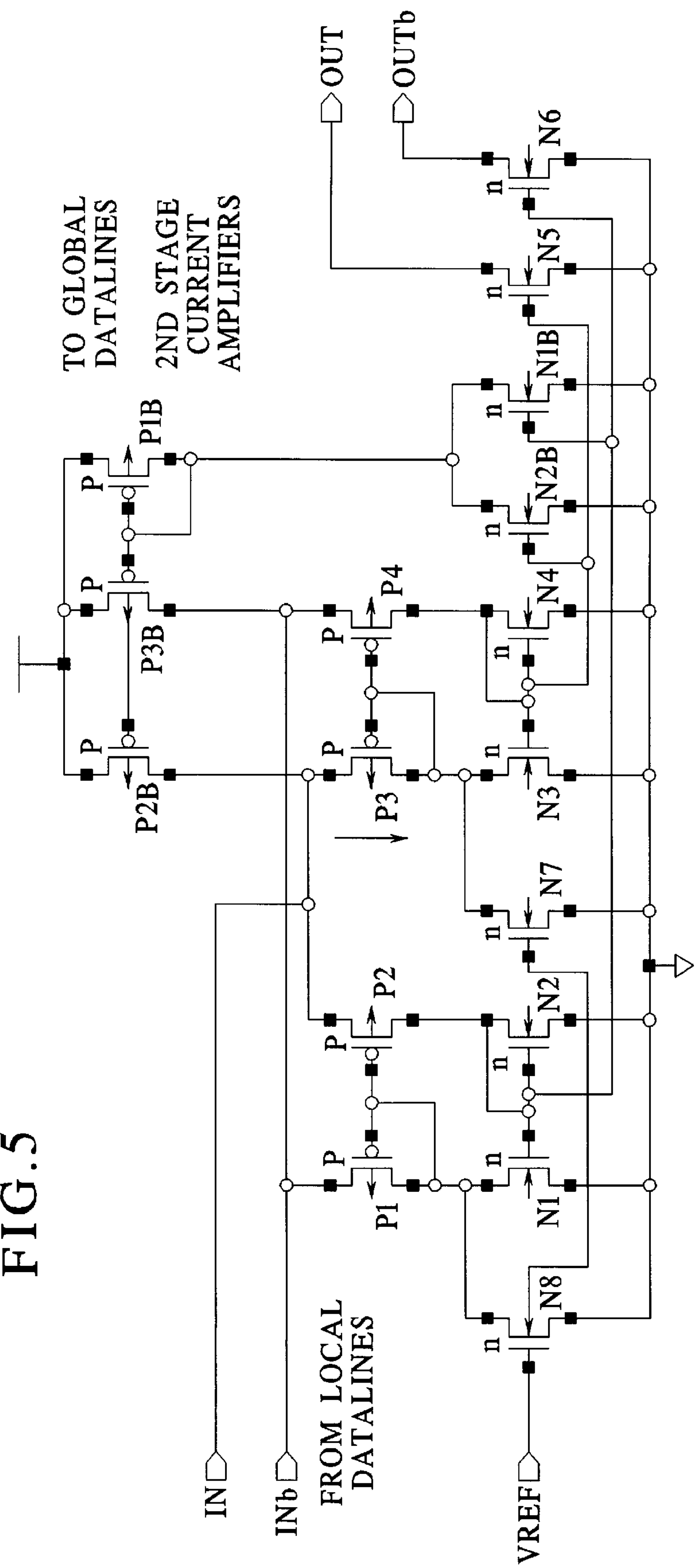
FIG. 5 is a schematic circuit diagram of the first stage of a current amplifier according to an alternative embodiment of the present invention, with a current source pull-up circuit.

There is a problem which arises when using the amplifier in FIG. 4 for SRAM implications. The current repetition property prevents the use of the amplifier in circuits that require multiple stages of sensing. When reading an SRAM memory cell, current flows in only one of two differential input data lines. If the amplifier is designed to meet the above criteria, no current will flow through one side of the amplifier. This has several consequences. First, it may be difficult to restart the amplifier when reading opposite data. Second, with one side of the amplifier shut down, it becomes impossible to drive successive amplifier stages. This situation is illustrated in FIG. 5. When reading the logic zero from a memory cell, current flows in an input device P3. With the amplifier designed as above, a current of equal magnitude will flow an input device P4. Conversely, no current flows in input devices P1 and P2. With this absence of current, output devices N1 and N2 and buffer device N6 begin to cut off. When these transistors near cutoff, transfer of current to the second stage amplifier is inhibited, causing either an unacceptable delay in reading the memory cell contents, or an improper read of the memory cell data.

Therefore, it is necessary to provide a bias circuit that keeps all the transistors operating deeply in the saturation region, preventing the shut down of one of the amplifiers and insuring current transfer to subsequent stages.

The circuit of FIG. 4 illustrates such a bias circuit. It provides means for generating a current which is a fraction of the "on side" amplifier current. This is accomplished by using a current mirror bias circuit, composed of PMOS transistors P5 and P6 and NMOS transistors N7, N8 and N9. Transistors P5, P6 and P9 have the same W/L ratios as the amplifier input, load and data line load transistors. Transistors N8 and N9, however, are scaled to transfer a fraction of this current to both halves of the amplifier. By creating a current flow, the "off side" of the amplifier is prevented from shutting down. By using this circuit, all transistors remain biased in the saturation region during a read operation. The amplifier can perform successive read operations of opposite data, and current can be successfully transferred to additional stages without read errors or additional delays.

The data line pull-up circuit illustrated in FIG. 1 uses PMOS transistors P7 and P8 biased in the linear region as pull-ups. The output gain of the amplifier can be increased by increasing the value of the resistance of the pull-up device. Besides providing amplifier bias to Vcc, the other function of the data line pull up device is to keep the data line DC common-mode voltage above the voltage necessary to write the memory cell. Using the linear PMOS load, the data line common-mode voltage drop is proportional to the value of R, namely the resistance of the pull-up device. The larger the value of R, the lower the data line common-mode voltage. Thus, the linear PMOS circuits limits the current gain in order to achieve the necessary data line DC common-mode voltage level.

The pull-up circuit illustrated in FIG. 5 employs a current source pull-up circuit. Here PMOS transistor P1B and NMOS transistor NlB generate a bias current. A multiple of the bias current is transferred to the data line and amplifier by PMOS devices P2B and P3B. The current source provides the necessary current to maintain the data line common-mode level, but has a much higher output impedance than the linear PMOS pull-up devices. Simulations have shown that for the same data line common-mode voltage level, the current source load circuit increases the current gain of the amplifier 25% over the gain of the amplifier with the linear PMOS pull-ups.

It will be apparent to those skilled in the art that various modifications and additions may be made in the apparatus of the present invention, without departing from the essential features of novelty thereof, which are intended to be defined and secured by the appended claims.

What is claimed is:

1. A semiconductor memory comprising a plurality of memory cells arranged in rows and columns and having a pair of bit lines for each column, and a two stage differential current sensing amplifier having a pair of input terminals connected to a pair of said bit lines, said differential current sensing amplifier having a pair of input transistors connected to said bit line pair and means for biasing said input transistors into conduction, whereby neither of said input transistors is cut off during reading or writing access to said memory at a time other than testing said memory.

2. The semiconductor memory according to claim 1, wherein the bit lines of said semiconductor memory do not have means for equalizing the voltage on said bit lines.

3. A semiconductor memory comprising a plurality of memory cells arranged in rows and columns at least one two stage differential current sensing amplifier having a pair of input terminals connected to a pair of bit lines, said differential current sensing amplifier having a pair of input transistors connected to said bit line pair and means for biasing said input transistors into conduction, and wherein neither of said input transistors is cut off during reading or writing access to said memory.

4. The semiconductor memory of claim 3, wherein the means for biasing is comprised of a pair of transistors with gate electrodes connected to a voltage reference.

* * * * *